United States Patent [19]

Matisoo et al.

[11] 3,906,538

[45] Sept. 16, 1975

[54] TECHNIQUES FOR MINIMIZING RESONANCE AMPLITUDES OF JOSEPHSON JUNCTION

[75] Inventors: Juri Matisoo, Yorktown Heights; Hans H. Zappe, Granite Springs, both of N.Y.

[73] Assignee: International Business Machines Corporation, Armonk, N.Y.

[22] Filed: Dec. 7, 1973

[21] Appl. No.: 422,960

[52] U.S. Cl. ........................ 357/5; 357/4; 307/306; 331/107 S

[51] Int. Cl.[2] ............... H01L 39/22; H01L 27/12; H01L 45/00; H03K 3/38

[58] Field of Search .. 331/107 S; 317/234 S, 234 T; 307/306, 277; 357/4, 5, 6

[56] References Cited

UNITED STATES PATENTS 3,697,826 10/1972 Mitani et al. .................... 317/234 R

*Primary Examiner*—Martin H. Edlow
*Attorney, Agent, or Firm*—Sughrue, Rothwell, Mion, Zinn & Macpeak

[57] ABSTRACT

The resonant conditions of non-linear Josephson junctions are reduced by shaping the junctions differently than a conventional rectangular shape. For a given value of $L/\lambda_J$, where L is the junction length and $\lambda_J$ is the Josephson penetration depth, non-rectangular junctions have reduced resonance current amplitudes when compared with rectangular junctions. The reduction in resonance current amplitudes allows the junction to be used in logic configurations with less stringent requirements on the current swings of the Josephson current required to perform switching.

9 Claims, 6 Drawing Figures

TECHNIQUES FOR MINIMIZING RESONANCE AMPLITUDES OF JOSEPHSON JUNCTION

BACKGROUND OF THE INVENTION

The invention is in the field of Josephson tunnelling junctions.

In the recent past there have been numerous publications describing the physics of junctions, methods of fabricating them, and applications for junctions. Reference is made to the following article, and the articles cited therein, for a comprehensive background on Josephson junctions:

"Josephson-Type Superconductive Tunnel Junctions and Applications," by Juri Matisoo, IEEE Transactions on Magnetics, Vol. MAG-5, No. 4, December, 1969. Because of certain characteristics of Josephson junctions they have been considered suitable for use as switching elements in logic devices. One characteristic is the ability of the junction to support a supercurrent up to a value, $I_m$, referred to as the maximum Josephson current, and to switch to a non-superconducting state when the current applied to the junction exceeds $I_m$. This switching can be accomplished by application of a magnetic field to the junction, as can be done using an adjacent current carrying control line. When the junction switches to the non-superconducting state, the d.c. voltage across the junction becomes $v=2\Delta/e$, where $2\Delta/e$ is the gap voltage. The other characteristic is the magnetic field dependence of $I_m$. By manipulating the applied magnetic field, a junction having a given gate current applied thereto can be made to switch from the $v=0$ state (superconducting) to the $v=2\Delta/e$ state.

The standard Josephson junction which has heretofore been used in logic applications is rectangular in shape, and it has been found that such junctions which have non-linear current distributions and exhibit an asymmetric curve of maximum Josephson current versus applied magnetic field are particularly suitable for logic applications. Typically, junctions for which $L/\lambda_J$ 2 are considered non-linear, where:

L is the junction length; and $\lambda_J$ is the Josephson penetration depth.

Most of the junctions presently found suitable have $L/\lambda_J$ values of from 2 to 5.

In the operation of circuits using these Josephson devices, it is desirable to switch them between the $v=0$ and $v=2\Delta/e$ states, in order to maximize the difference between the two stable states of a Josephson device. However, the presence of resonances often prevents switching to the voltage $2\Delta/e$, as will now be discussed. This resonance problem concerns the tendency of the junctions to resonate at voltages less than $2\Delta/e$ when an attempt is made to switch the junction. It is well known that a characteristic of Josephson junctions, in addition to those mentioned above, is the ability to produce an oscillating supercurrent whose frequency is proportional to the d.c. voltage, e.g., 483 MHz/$\mu$V. The introduction of these oscillating supercurrents into non-linear junctions appears to cause definite resonant steps in the d.c. I-V curve of a junction.

It is an object of the present invention to provide a means for minimizing the production of standing waves in a Josephson tunnelling device.

Another object of the invention is to provide means for destroying the effective Q of a Josephson tunneling device.

It is an object of the present invention to provide a Josephson junction having reduced resonance current amplitudes compared to prior Josephson junctions having comparable $L/\lambda_J$ values.

Another object of the present invention is to prevent a Josephson junction from resonating when an attempt is made to switch the junction.

SUMMARY OF THE INVENTION

In accordance with the present invention the problem of a junction locking in on one of the resonant steps is substantially reduced. This reduction is achieved by the provision of means for damping these resonances. In particular, the junction is shaped to reduce the conditions, such as reinforcement of waves due to reflection, that normally enhance resonance. It has been discovered that the resonance current amplitudes of a non-rectangular junction are significantly less than the resonant current amplitudes of a rectangular junction having the same $L/\lambda_J$ value.

DETAILED DESCRIPTION OF THE PREFERRED EMBODIMENT

Figure 1:
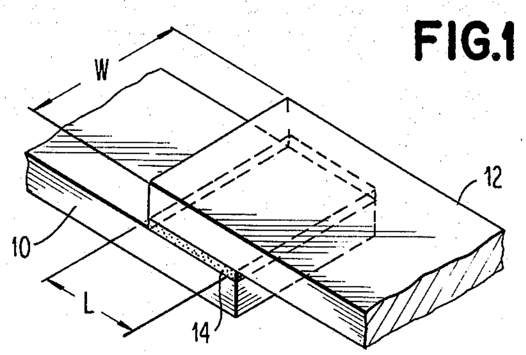
FIG. 1 is a perspective view of a prior art Josephson junction.

A typical Josephson junction of the type used as the switching element of logic devices is shown in FIG. 1. The device comprises two superconductors, 10 and 12, which are made from a suitable material such as lead, and a thin tunnelling barrier 14 (such as an oxide layer). The junction is the region where the superconductor-barrier-superconductor sandwich arrangement exists. Current flowing between the two superconductors passes through the junction. The junction has a length, L, and a width, W.

The d.c. I-V characteristic of a junction of the latter type is illustrated by the graph in FIG. 2 where the gate current, $I_g$, applied between superconductors 10 and 12 is plotted along the ordinate and the voltage across the junction is plotted along the abscissa. For the present the resonant steps 18 may be ignored.

The junction acts as a superconductor for currents up to the Josephson current $I_m$. For currents less than $I_m$, the voltage across the junction remains at zero volts. For gate currents above $I_m$, the voltage jumps to $2\Delta/e$, where $2\Delta/e$ is the gap voltage. The curve 20 represents the I-V characteristic prior to switching, whereas the curve 22 represents the I-V curve after switching. As previously stated, switching can be achieved by applying a magnetic field to the junction, using for instance a current carrying control line. It will be noted that once the device has been switched, a mere lowering of $I_g$ below $I_m$ will not cause the junction to switch back to the $v=0$ state.

In typical logic device applications a resistive output path is fabricated in parallel with the junction and a constant gate current $I_g$ flows between superconductors 10 and 12, where $I_g < I_m$. Switching is accomplished by changing the applied magnetic field to vary the maximum Josephson current to $I_m'$, where $I_m' < I_g$.

Non-linear junctions have been found particularly suitable for use as the switching elements of logic devices. Basically, a non-linear junction is one in which the current through the junction is non-uniform. Junctions for which $L/\lambda_J \geq 2$ are considered non-linear. L is the junction length and $\lambda_J$ is the Josephson penetration depth.

In non-linear junctions, self-fields become important, and the resulting non-uniform Josephson current density gives rise to highly non-linear behavior, statically as well as dynamically. The non-uniform current distribution is responsible for abrupt current steps in the d.c. I-V curve. These abrupt current steps are shown by curves 18 in FIG. 2. These steps are vortex modes inside the junction and they indicate the ability of the junction to resonate. The amplitude of the current steps typically is greater, the greater the non-linearity of the junction, i.e., the greater the value of $L/\lambda_J$, the larger the amplitude of the current steps. The amplitudes can be sufficiently large that they interfere with the use of the junction as the switching element in a device, such as a logic circuit. This interference can be understood by referring again to the graph of FIG. 2 and considering the same switching example described above, with the addition of the current steps 18.

It is assumed that the switching element is to be operated by varying the applied magnetic field such that the maximum Josephson current varies from $I_m$ to $I_m'$. It is also assumed that the applied current $I_g$ is between $I_m$ and $I_m'$ in magnitude. When the maximum Josephson current is $I_m$, the entire gate current $I_g$ flows through the junction and the junction remains in the $v=0$ state. When the maximum Josephson current is shifted to $I_m'$ ($\leq I_g$), the junction would normally jump to the $v=2\Delta/e$ state as shown by the dotted line 24. The finite voltage across the junction results in an output current of $2\Delta/2eR$ flowing through the parallel output path, where 2eR is the d.c. resistance of the output path.

Figure 2:
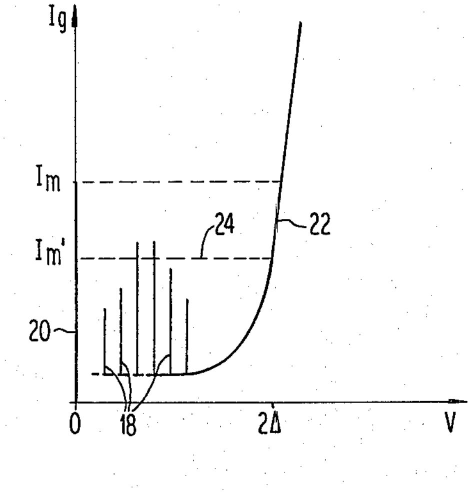
FIG. 2 is a graph of the d.c. I-V characteristics of a Josephson junction.

However, as seen in FIG. 2, the amplitudes of some of the current steps are greater than $I_m'$. Consequently, instead of the junction switching from $v=0$ to $v=2\Delta/e$, it may jump instead to one of the resonant modes represented by current steps 18. The junction can lock in a resonant mode and never reach $v=2\Delta/e$, or it may jump from one resonant mode to another resonant mode and eventually to $2\Delta/e$. In any case it will be appreciated that the failure of the junction to switch to $2\Delta/e$ at the instant the value of the maximum Josephson current is changed to the low value, $I_m'$, hinders the junction's usefulness as a logic device.

One technique for avoiding the resonant modes would be to raise $I_m'$ to a value above the maximum amplitude of the current steps. However, this cuts down to the flexibility desired in designing circuitry (such as logic gates) by limiting the Josephson current swings to very narrow regions. Furthermore, even this restriction would not suffice in certain cases where the maximum current steps have amplitudes as high as the maximum Josephson current in zero field. For example, in rectangular junctions having $L/\lambda_J = 5$, the amplitude of the current steps can reach as high as the maximum Josephson current in zero field. It will be noted that the ratio of $I_R/(I_m)_0$ decreases as $L/\lambda_J$ increases, where $(I_m)_0$ is the maximum Josephson current in zero field and $I_R$ is the maximum amplitude of the current steps.

A discussion of the resonance phenomena may be found in "Dynamic Behavior of Josephson Tunnel Junctions in the Subnanosecond Range," by H. H. Zappe and K. R. Grebe, J. Appl. Physics., Vol. 44, No. 2, February, 1973, pp. 865–874. For present purposes it will suffice to consider the junction as a cavity or strip line. The more non-linear the junction, the more the current therethrough is confined to the edge of the junction. Josephson oscillations entering the junction travel the length, L, as if the junction were a cavity of length, L, and are reflected. As in a cavity, reinforcement of the reflections results in standing waves and this introduces resonant modes in the junction.

One technique for reducing the ratio $I_R/I_m$ would be to make the junction length so small that the only resonant mode supportable by the junction would be at the frequency equal to the plasma frequency of the metals. Here tremendous damping of the frequency occurs. This technique is not too practical presently because it requires a junction length of only a few microns.

If the junction length in the direction of current flow is made small, the frequency of resonance increases. As the frequency increases, the voltage at which resonances occur increases also. For these small junctions, the voltage at which resonances occur (including voltages at which harmonics of the fundamental resonances occur) are in the region of operation where large damping exists. For a voltage at the gap voltage damping is maximum.

A more practical approach to the problem, and one that is applicable irrespective of the size of the junction, is to change the shape of the edge or edges of the junction so that the junction is no longer rectangular. One effect of the altered shape is to introduce an irregularity into the junction "cavity" thereby lowering the Q of the cavity. By removing the parallelism between the edges of the junction, the junction's ability to support standing waves is significantly reduced.

The above explanation is far from a complete description of the physical changes brought about by changing the shape of the junction edges. It is based on the "cavity" concept of a junction. However, it should be appreciated that a junction is a highly non-linear cavity and the Q of the cavity is not constant. The shape also appears to affect the excitation of the junction which in turn affects the amount of energy pumped into the resonant modes. Thus, the shape has a double effect on resonance amplitudes.

Figure 4:
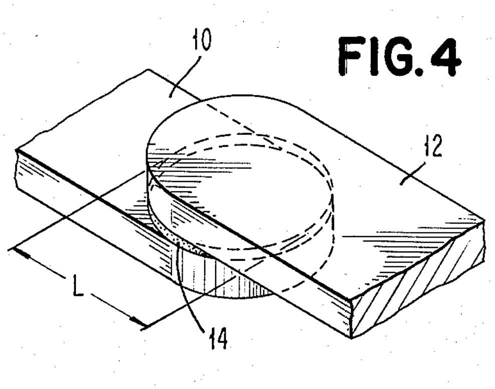
FIGS. 3, 4 and 5 are perspective views of Josephson junctions shaped to reduce resonance amplitudes.
Figure 3:
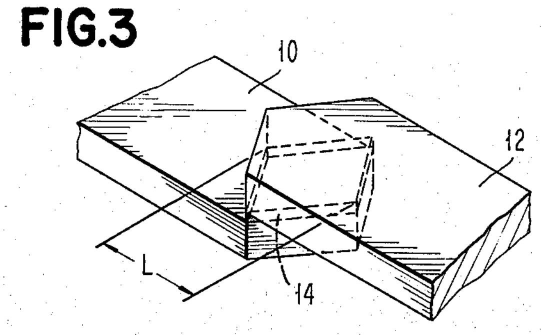
Figure 5:
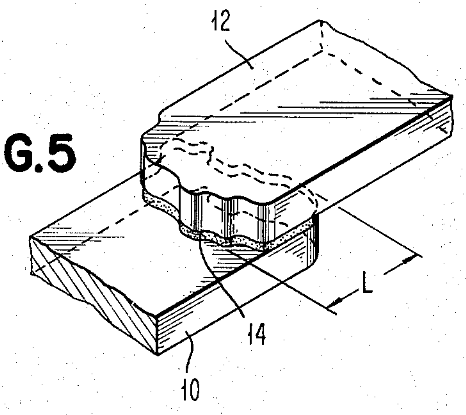

Although generally it appears that the shape may be any in which the edges at opposite ends of the junction length are not completely parallel to one another producing a nonrectangular shape, certain examples of non-rectangular shaped junctions having reduced $I_R/I_m$ for a given value of $L/\lambda_J$ are shown in FIGS. 3, 4 and 5. FIGS. 3 and 4 illustrate regular shaped non-rectangular junctions having triangular or circular shaped edges, whereas FIG. 5 illustrates an irregular shaped junction. The reference numerals used iin FIGS. 3, 4 and 5 are the same as those in FIG. 1, where the junctions of the elements are the same.

Tests conducted on junctions shaped as in FIGS. 1, 3 and 4 showed a significant decrease in $I_R/I_m$ for a given value of $L/\lambda_J$ when one changes from rectangular shaped junction to a nonrectangular shaped junction.

Figure 6:
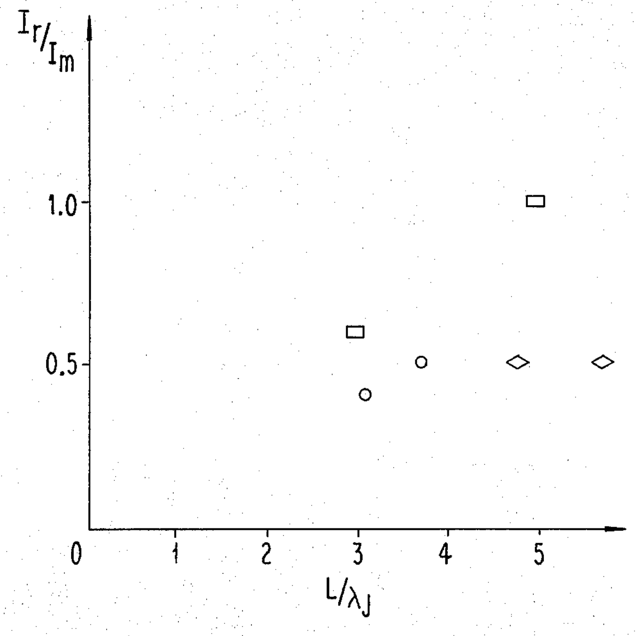
FIG. 6 is a graph illustrating the reduction in resonance amplitudes due to non-rectangular shaping of the Josephson junction.

The test results are tabulated below and illustrated in FIG. 6, wherein the shape of the symbol on the graph represents the shape of the junction tested.

Table

| Shape | $L/\lambda_J$ | $I_R/I_m$ |
|---|---|---|
| Rectangle | 5.0 | 1.0 |
| Rectangle | 3.0 | 0.6 |
| Diamond | 5.7 | 0.5 |
| Diamond | 4.5 | 0.5 |
| Circle | 3.0 | 0.4 |
| Circle | 3.5 | 0.5 |

Thus, these Josephson tunnelling devices are characterized by electrodes and tunnel barriers which have means associated with them to minimize the production of standing waves in the device, and to destroy the effective Q of the device. The means for minimizing resonances includes portions of the device which will not allow a continual build up of waves corresponding to identical electro-magnetic reflections. A distinct advantage of this technique for minimizing resonance is that the Josephson devices of the present invention can be fabricated using standard processes such as evaporation, oxidation, etc.

What is claimed is:

1. A Josephson tunnelling junction of the type having resonant steps in the current-voltage characteristic of said junction, said junction comprising first and second superconductors in contact with and separated by a tunnelling barrier, and said junction having a shape which reduces the amp litudes of said resonant steps.

2. A Josephson tunnelling junction as claimed in claim 1 having a non-rectangular shape in the plane of said junction and having a lower ratio of maximum resonance current to maximum Josephson current than a substantially identical but rectangular junction.

3. A Josephson junction as claimed in claim 1 wherein said shape is a diamond shape.

4. A Josephson junction as claimed in claim 1 wherein said shape is a curved shape.

5. The Josephson junction of claim 4, wherein said curved shape comprises circular portions.

6. A Josephson tunnel device, comprising:

first and second superconducting electrodes;

a tunnel barrier located between said first and second electrodes, said barrier being sufficiently thin to support Josephson tunnelling current therethrough; and means for minimizing oscillating supercurrents in said device.

7. The device of claim 6, where said means for minimizing includes portions of said electrodes and said tunnel barrier which prevent the build up of electromagnetic reflections in said device.

8. The device of claim 7, where said portions have geometries which prevent substained reflections of electromagnetic energy in any direction.

9. A method of fabricating a Josephson junction comprising the steps of, forming a tunnelling barrier on a first superconductor layer, forming a second superconducting layer on said tunnelling barrier, and shaping said superconductor layers and said tunnelling barrier to reduce resonance reinforcing reflections of Josephson oscillations in said junction.

* * * * *

UNITED STATES PATENT AND TRADEMARK OFFICE

CERTIFICATE OF CORRECTION

PATENT NO. : 3,906,538

DATED : September 16, 1975

INVENTOR(S) : Juri MATISOO et al

It is certified that error appears in the above-identified patent and that said Letters Patent are hereby corrected as shown below:

IN THE SPECIFICATION:

Column 1, line 16 - "Because" should be the beginning of a new paragraph .

Column 1, line 42 - Before "2" insert -- $\geq$ --

Column 3, line 57 - Delete "to" and insert -- on --

Column 4, line 62 - Delete "iin" and insert -- in --

Signed and Sealed this

***thirtieth* Day of *December 1975***

[SEAL]

*Attest:*

RUTH C. MASON
*Attesting Officer*

C. MARSHALL DANN
*Commissioner of Patents and Trademarks*